United States Patent
Chen et al.

(10) Patent No.: US 6,392,263 B1
(45) Date of Patent: May 21, 2002

(54) INTEGRATED STRUCTURE FOR REDUCED LEAKAGE AND IMPROVED FILL-FACTOR IN CMOS PIXEL

(75) Inventors: Zhiliang J. Chen; Kuok Y. Ling; Hisashi Shichijo, all of Plano, TX (US); Katsuo Komatsuzaki, Ibaraki (JP); Chin-Yu Tsai, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/855,251

(22) Filed: May 15, 2001

(51) Int. Cl.$^7$ ................................................ H01L 29/72

(52) U.S. Cl. ..................... 257/292; 257/232; 257/233; 257/290; 257/291; 257/369; 257/371

(58) Field of Search ................................ 257/290, 291, 257/292, 232, 233, 369, 371

(56) References Cited

U.S. PATENT DOCUMENTS 6,297,070 B1 * 10/2001 Lee et al. .................... 257/291

* cited by examiner

Primary Examiner—Edward Wojciechowicz
(74) Attorney, Agent, or Firm—Gary C. Honeycutt; Fred Telecky; Arthur I. Navarro

(57) ABSTRACT

A densely integrated pixel, fabricated by CMOS technology, comprises a photodiode formed by a n-well, with cathode, surrounded by a p-well; a reset MOS transistor formed such that its polysilicon gate is positioned, for diode control, across the junction formed by p-well and n-well regions, and its source is merged with the photodiode cathode; and a sensing MOS transistor formed such that its source is combined with the drain of the reset transistor and its gate is electrically connected to the source of the reset transistor.

In the pixel of the invention, the photodiode leakage current is greatly reduced, because no n+/p-well junction is connected to the photodiode, and the fill factor is improved, because the pixel size is much reduced.

18 Claims, 2 Drawing Sheets

INTEGRATED STRUCTURE FOR REDUCED LEAKAGE AND IMPROVED FILL-FACTOR IN CMOS PIXEL

FIELD OF THE INVENTION

The present invention is related in general to the field of electronic systems and semiconductor devices, and more specifically to photodiodes and pixels fabricated by the CMOS technology, yet having reduced dark current, improved light sensitivity and responsivity, and high level of integration.

DESCRIPTION OF THE RELATED ART

Digital imaging devices are becoming increasingly popular in a variety of applications such as digital cameras, fingerprint recognition, and digital scanners and copiers. Typical prior art digital imaging devices are based on Charge Coupled Device (CCD) technology. CCD devices have an array of CCD cells, each cell comprising a pixel. Each CCD pixel outputs a voltage signal proportionate to the intensity of light impinging upon the cell. This analog voltage signal can be converted to a digital signal for further processing, digital filtering, and storage. As is well known in the art, a two-dimensional digital image can be constructed from the voltage signal outputs created by a two-dimensional array of CCD cells, commonly referred to as a sensor array.

CCD arrays have the shortcoming that the CCD fabrication requires a special process flow, which is not compatible with the standard CMOS process flow dominating today's manufacturing technology due to its flexibility and low cost. Consequently, the CCD array cannot be easily integrated with other logic circuits, such as CCD control logic and analog-to-digital converters. Additionally, in operation, a CCD array requires multiple high voltage supplies from 5 V to 12 V, and tends to consume a large amount of power.

CMOS technology has recently been considered for imager application. CMOS area (or 2-dimensional) sensor arrays can be fabricated in standard CMOS process and thus other system functions, such as controller, analog-to-digital, signal processor, and digital signal processor, can be integrated on the same chip. CMOS area array sensors (or CMOS imagers) can operate with a single low supply voltage such as 3.3 V or 5.0 V. The cost of CMOS processing is also lower than that of CCD processing. The power consumption of a CMOS sensor is lower than that of a CCD sensor.

In order to fabricate photodiodes and pixels in CMOS technology, however, a number of problems have to be overcome, foremost the unacceptably high level of reverse bias leakage or "dark" current of the photodiodes. Another challenge is the best possible level of integration, the so-called "fill factor". The reverse bias or dark current is dominated by generation current in the junction depletion region. This current is proportional to the depletion width and the intrinsic carrier concentration, and inverse proportional to the recombination lifetime. Methods to reduce the dark current include lowering the temperature, or operating at lower supply voltage, or reducing the recombination/generation centers in the depletion region. The latter option is the most promising.

The recombination/generation centers originate mainly from
  lattice defects introduced during processing, especially
    implant damage not annealed by subsequent thermal treatment;
    damage induced by reactive ion etching (such as gate poly-silicon and shallow trench isolation etching);
    stress-induced defects, for instance at STI edges;
  surface states, prominently
    electron traps at the Si—SiO2 interface;
    depletion region extending to and including the silicon surface directly under the oxide;
  impurities, for example
    dopants and
    metal contamination primarily from silicide.

In known technology, a number of approaches have been described to minimize at least several of these origins and thus reduce the dark current. In U.S. Pat. No. 5,625,210, issued Apr. 29, 1997 (Lee et al., "Active Pixel Sensor Integrated with a Pinned Photodiode"), extends the concept of a pinned photodiode, known in CCD technology, by integrating it into the image sensing element of an active pixel sensor, fabricated in CMOS technology. An additional first implant creates a photodiode by implanting a deeper n+ dopant than used by the source and drain implants, increasing the photo-response. An additional pinning layer implant, using high doses of a low energy p+ dopant, is then created near the surface; this pinning layer is not in electrical contact with the p-epitaxial layer over the p-substrate. This approach has many additional process steps and is too expensive for mass production.

Other approaches to reduce the dark current have been described at technical conferences such as ISSCC 1999, ISSCC 2000, and IEDM 2000. These approaches include optimizing the shallow trench liner oxidation in order to minimize defects at the active edge, blocking silicide, annealing with hydrogen in order to passivate defects, varying anneal cycles and well junction depths. Non of these efforts were completely satisfactory, especially with respect to minimum number of process steps and low cost manufacturing.

The challenge of cost reduction implies a drive for minimizing the number of process steps, especially a minimum number of photomask steps, and the application of standardized process conditions wherever possible. These constraints should be kept in mind when additional process steps or new process conditions are proposed to reduce photodiode dark current and improve light sensitivity and responsivity without sacrificing any desirable device characteristics. An urgent need has, therefore, arisen for a coherent, low-cost method of reducing dark current in photodiodes fabricated by CMOS technology, and, simultaneously, improve the degree of component integration at the pixel level. The device structure should further provide excellent light responsivity and sensitivity in the red as well as the blue spectrum, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

A highly integrated pixel, fabricated by CMOS technology, is described, comprising a photodiode formed by a n-well, with cathode, surrounded by a p-well; a reset MOS transistor formed such that its polysilicon gate is positioned across p-well and n-well regions and its source is merged with the photodiode cathode; and a sensing MOS transistor formed such that its source is combined with the drain of the reset transistor and its gate is electrically connected to the source of the reset transistor.

In the pixel of the invention, the photodiode leakage current is greatly reduced, because no n+/p-well junction is connected to the photodiode, and the fill factor is improved, because the pixel size is much reduced.

The invention applies to semiconductors both of p-type and n-type as "first" conductivity types; preferably, the semiconductors are in the 1 to 50 Ωcom resistivity range. The semiconductor may consist of an epitaxial layer deposited on higher conductivity substrate material.

It is an aspect of the invention that the pixel is fabricated with deep sub-micron CMOS technology (such as 0.18 µm and smaller), yet the large dark (leakage) current is greatly reduced, since no longer a n+/p-well junction is connected to the photodiode.

Another aspect of the invention is that the manifold integration reduces the silicon "real estate" consumed by the pixel; consequently, the "fill factor" is much improved, and the fabrication cost lowered.

Another aspect of the invention is that the concept of creating buried near-the-surface junctions and thus reducing the effect of surface-related leakage caused by traps, dangling bonds, and recombination/generation centers can be utilized.

It is an essential aspect of the present invention that the shallow compensating p-well in the n-well can be created without an additional ion implant step by using the general p-well implant. The design of the location and periphery of the remaining n-well is flexible.

Another aspect of the invention is that the compensating p-well increases the total junction depletion region of the photodiode. Consequently, more carriers are generated in the photodiode per incident light, resulting in a more sensitive photodiode.

Another aspect of the invention is that the newly created compensating p-well/n-well junction is near and about parallel to the surface. Consequently, an increased responsivity to the short wavelength spectrum is created.

Another aspect of the invention is that the n+ silicidation can be separated from the photodiode depletion region by inserting a short shallow trench isolation (STI) layer (which does not consume much real estate). This eliminates the risk of any heavy metal contamination and subsequent formation of generation-recombination centers in the depletion region—a well known source of junction leakage current.

It is a technical advantage of the present invention that the dopant concentrations and the junction depths of the compensating p-well, the n-well, and/or the p-well and p-substrate can be manufactured according to predetermined device and process modeling, and are thus very flexible.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent application Ser. No. 09/848,637 filed on May 1, 2001 (Chen et al., "CMOS Photodiode having Reduced Dark Current and Improved Light Sensitivity and Responsivity"), which is herewith incorporated by reference.

Figure 1B:
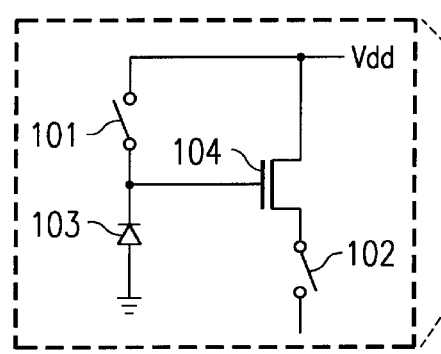
FIG. 1B shows the schematic of an individual pixel of the array in FIG. 1A, highlighting the location of the light-sensing diode.
Figure 1A:
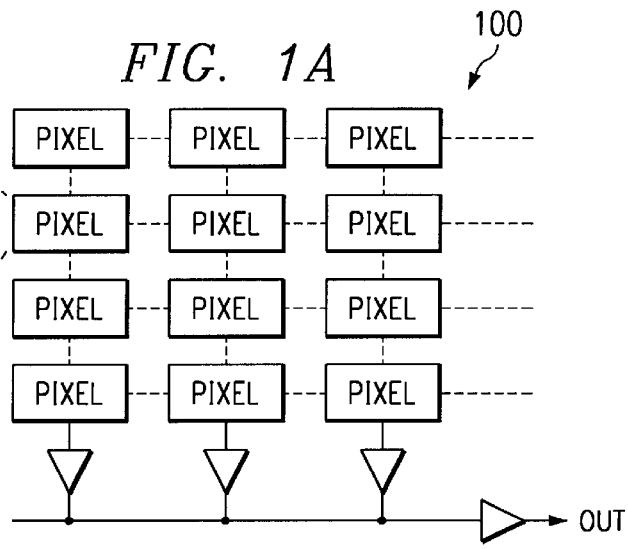
FIG. 1A depicts schematically a 2-dimensional CMOS sensor array.

FIG. 1A is a schematic example of a 2-dimensional CMOS sensor array and pixel scheme, generally designated 100. FIG. 1B, an insert to FIG. 1A, illustrates a layout of an individual pixel. The pixel reset switch is designated as 101 and the pixel select switch as 102. During reset operation, the reset switch 101 is closed and the photodiode 103 is then biased up to Vdd. During the light sensing period, the reset switch 101 is open. The photodiode voltage Vdd will be decreased, due to the photodiode charge being discharged by carriers generated from an incident light. The change of photodiode voltage is thus measured by a sensing NMOS transistor 104 by closing the reset switch 101.

Figure 1C:
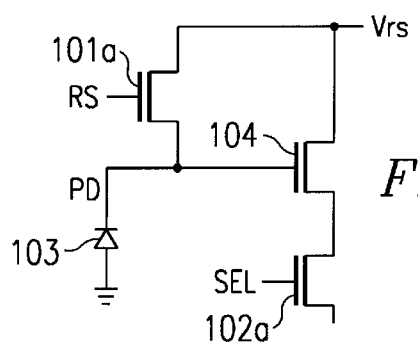
FIG. 1C repeats the schematic of the pixel in FIG. 1B, emphasizing the MOS transistors.

The CMOS pixel schematic of FIG. 1C redraws FIG. 1B in order to show the MOS transistors included in the pixel. The photodiode 103 is coupled to the reset transistor 101a and the sensing transistor 104; the selection transistor 102a is coupled to the sensing transistor 104. Vdd is renamed reset voltage Vrs.

Figure 2:
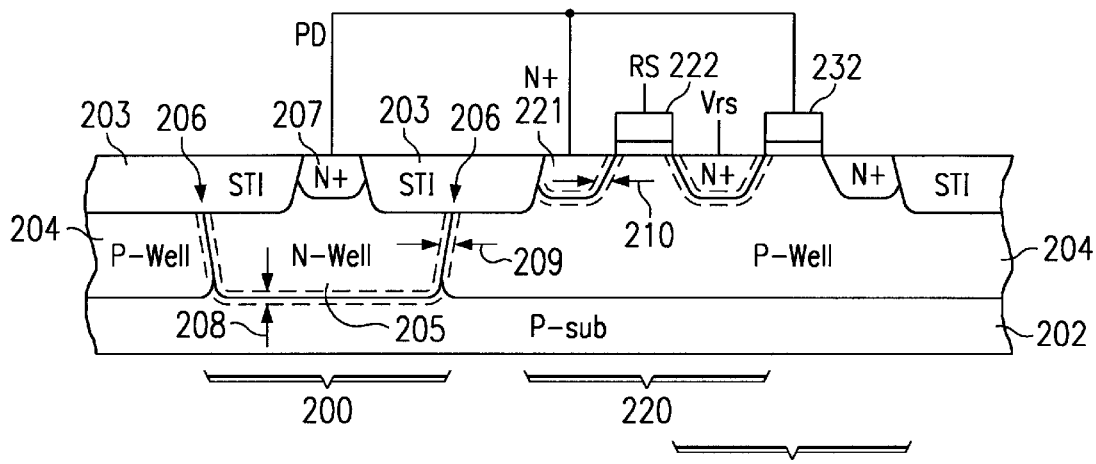
FIG. 2 is a simplified and schematic cross section of the pixel shown in FIGS. 1B and 1C, for known CMOS technology.

The impact of the present invention can be most easily appreciated by highlighting the shortcomings of the known technology. FIG. 2 illustrates a typical CMOS pixel in deep sub-micron CMOS technology, consisting of the photodiode 103 and three transistors (transistor number three, the selection transistor, is not shown in FIG. 2). The photodiode, generally designated 200, uses p-type silicon substrate 202. An insulating layer 203 of shallow trench isolation (STI) protects one surface of substrate 202. Into substrate 202 has been fabricated a p-well 204, which surrounds an n-well 205. The junctions between p-well 204 and n-well 205 are formed by the n-well/p-substrate portion (indicated by its space charge or depletion region 208 under reverse bias) and the n-well/p-well peripheral portions (again indicated by their depletion regions 209). Junction portions 209 intersect the surface, protected by the insulator 203, along line 206. A heavily n-doped region 207 enables electrical contact to n-well 205.

The reset transistor 220, operable as the reset switch, connects the photodiode 200 to the reset voltage supply Vrs. The contributions to the photodiode leakage current come from several sources:

n-well/p-substrate junction 208 leakage;
n-well/p-well junctions 209 leakage;
n+/p-well junctions 210 leakage; and reset transistor 220 off current when RS voltage Vrs is low.

In deep sub-micron CMOS technology with its ongoing trend towards miniaturization, the leakage current from the n+/p-well junctions is dominant. Consequently, the overall pixel dark current is high. Its magnitude limits the pixel performance and CMOS imager performance. Another disadvantage is that the minimum space requirement of the n+ diffusion to the n-well results in a large pixel size and, therefore, low density or "fill factor".

In FIG. 2, the sensing transistor is designated 230. It is partially merged with reset transistor 220; its gate 232 is electrically connected to the diode cathode 207 and the source 221 of the reset transistor. The selection transistor is not shown in FIG. 2. The gate 222 of the reset transistor is connected to the reset voltage supply.

Figure 3:
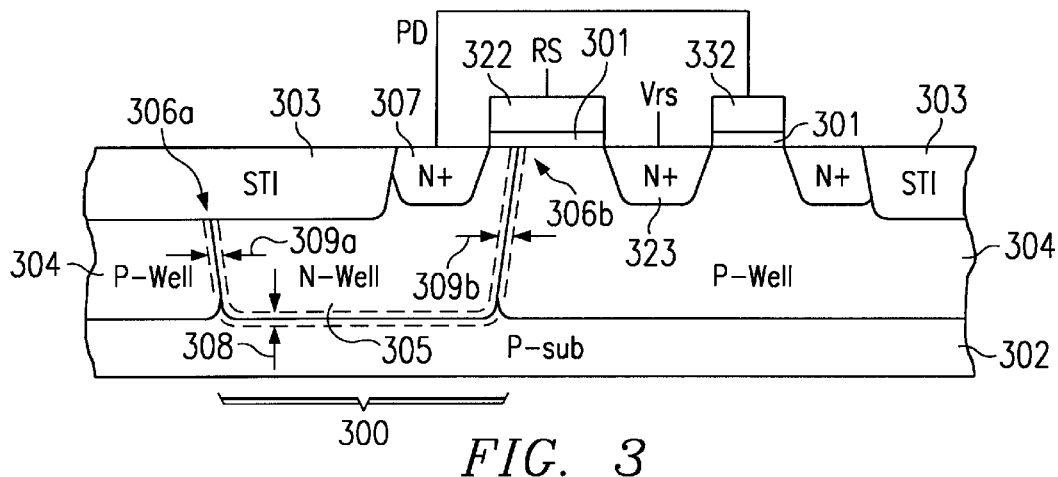
FIG. 3 is a simplified and schematic cross section of the first embodiment of a pixel according to the present invention.

The photodiode dark current is greatly reduced, and the pixel fill factor improved, by the embodiments of the present invention. FIG. 3 illustrates the first embodiment. FIG. 3 is a simplified, schematic cross section of the pixel, drawn in analogy to FIG. 2 for easy comparison. The photodiode, generally designated 300, uses p-type silicon substrate 302. As defined herein, the term "substrate" refers to the starting semiconductor wafer. As shown in FIG. 3, in present manufacturing, the substrate typically has p-type doping. For clarity, this case is also selected as the basis for the following discussions. It should be stressed, however, that the invention and all description also cover the case where the substrate has n-type doping. In FIG. 3, the substrate is designated 302. Frequently, but not necessarily, an epitaxial layer of the same conductivity type as the substrate has been deposited over the substrate; in this case the term "substrate" refers to epitaxial layer plus starting semiconductor.

An insulating STI layer 303 protects one surface of substrate 302. Using STI technology in deep sub-micron CMOS process, gate insulators (usually oxides) 301 can be formed wherever needed.

Into substrate 302 has been fabricated a well 304 of the conductivity type of the substrate (a p-well). It surrounds a well of the opposite conductivity type, an n-well 305. The junctions between p-well 304 and n-well 305 are formed by the n-well/p-substrate portion (indicated by depletion region 308 under reverse bias) and the n-well/p-well peripheral portions (indicated by depletion regions 309a and 309b under reverse bias). It is important to notice that junction portion 309a intersects the surface, protected by the insulator 303, along line 306a, while junction portion 309b intersects the surface under gate oxide 301 along line 306b. A heavily n-doped region 307 enables electrical contact to n-well 305.

The MOS reset transistor, operable as the reset switch RS, is integrated with the photodiode such that
  the source of the reset transistor is merged with the n+ cathode 307 of the photodiode;
  drain 323 of the reset transistor is connected to the reset voltage supply Vrs; and
  gate 322 is positioned on the gate oxide 301 such that it extends across regions of p-well 304 and n-well 305; consequently, gate 322 extends across junction 309b at line 306b, and thus provides control of photodiode 300. When the pixel is in the reset mode, switch RS goes high, an n-channel will be formed in the p-well portion under gate 322; the photodiode is thus reset to voltage Vrs.

The MOS sensing transistor has source, drain and gate, and is integrated with the reset transistor such that
  the source of the sensing transistor is combined with the reset drain 323; and
  the gate 332 is electrically connected to reset source 307.

In the integrated pixel of FIG. 3, no n+/p-well junction is connected to the photodiode. Consequently, the first embodiment of the present invention depicted in FIG. 3 has a greatly reduced photodiode leakage current compared to the conventional CMOS structure depicted in FIG. 2. Furthermore, by eliminating the extra n+ diffusion of the n-well contact, the density of integration represented by FIG. 3 is higher compared to the more area-consuming conventional design of FIG. 2.

Figure 4:
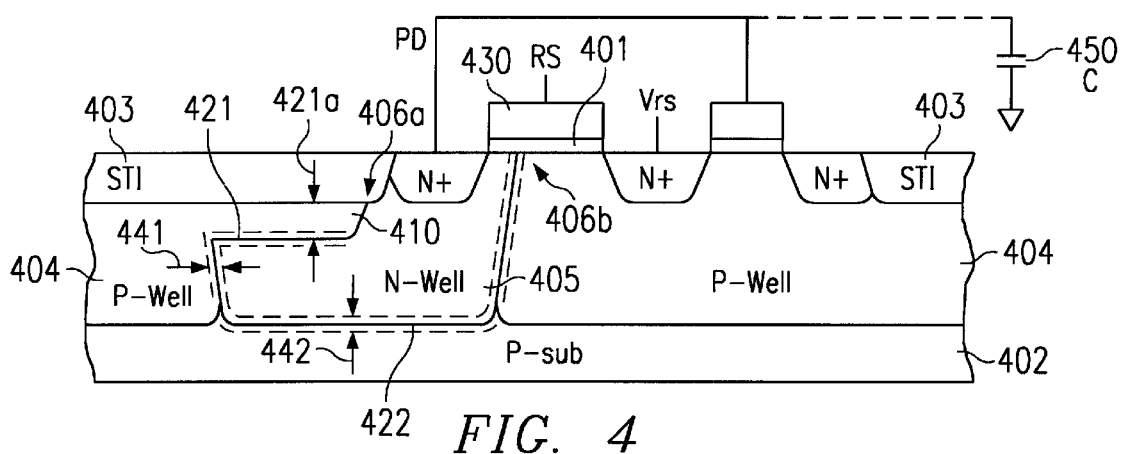
FIG. 4 is a simplified and schematic cross section of the second embodiment of a pixel according to the present invention.

FIG. 4 illustrates the second embodiment of the present invention. The well 404 of the first conductivity type (p-type) has at least one extension 410 (also p-type) along the surface under the insulator 403 into the well 405 of the opposite conductivity type (n-type). Extension 410 may be called a "compensating p-well", since it is p-doped to overcompensate the n-doping of well 405. This compensating p-well 410 forms a buried, near-the-surface junction 421 with well 405. Junction 421 is approximately parallel to the semiconductor surface and insulator layer 403. Practical distances 421a of junction 421 from the surface with the STI layer have been manufactured in the 0.5 to 1.0 μm range.

With the geometry of compensating well 410, junctions extend in two different planes under the semiconductor surface, oriented approximately parallel to the surface: Junction 421 of the compensating p-well 410 with n-well 405, and junction 422 of the n-well 405 with p-substrate 402.

Junction 421 of the compensating p-well 410 intersects the surface under the insulating layer 403 at line 406a, minimizing the surface junction as compared to the intersect 306a illustrated in FIG. 3. The intersect 406b with the gate oxide 401, crucial for the present invention, remains under gate 430. Since the compensating p-well eliminates the largest portion of the surface junction, it diminishes the total photodiode leakage/dark current.

When electrical reverse bias is applied to the photodiode, space charge/depletion regions are formed at the junctions. At junction 421, depletion region 441 is formed, at the junction 422, depletion region 442. As FIG. 4 demonstrates, the total junction depletion region of the photodiode is significantly increased, compared to the conventional diode in FIG. 2. Consequently, more carriers can be generated in the photodiode for a given incident light, resulting in a more sensitive photodiode.

In addition, due to the proximity of junction 421 to the semiconductor surface, the responsivity of the photodiode to the shorter wavelength spectrum is improved.

The fabrication of the compensating p-well in deep submicron CMOS technology does not necessarily require extra process steps. In some twin well CMOS processes, the p-well concentration is higher than the n-well concentration near the silicon surface, and the n-well concentration is higher than the p-well concentration deeper below the silicon surface. In such cases, the n-well is first formed, and an opening is then made in the p-well mask over the photodiode n-well. This opening of the n-well receives then the same p-well implants as the core p-well regions, resulting in the formation of the compensating p-wells.

A capacitor 450 may be added to the photodiode node in order to reduce the charge injection effect of the reset switch. Capacitor 450 may be formed by a MOS capacitor.

Figure 5:
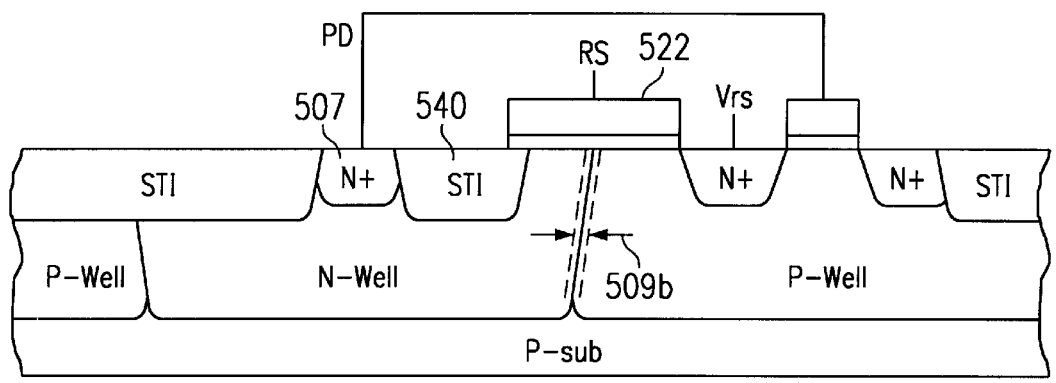
FIG. 5 is a simplified and schematic cross section of the third embodiment of a pixel according to the present invention.

FIG. 5 illustrates the third embodiment of the present invention. The schematic cross section of the pixel is similar to the cross section in FIG. 3 except for the insertion of a small isolation region 540 as a geometrical separation between photodiode cathode/reset source 507 and reset gate 522. Region 540 preferably is an STI layer. By the insertion of layer 540, the n+ silicidation 507 is kept separate from the depletion region 509b, which is formed along the n-well/p-well junction when the photodiode is reverse biased. It is well known that heavy metal can migrate to junction depletion regions if the metal source is geometrically close to the junction. Such heavy metal contamination in the depletion region will act as generation/recombination centers that lead to increased junction leakage current.

Referring to the second embodiment (FIG. 4) with a light-sensing diode of minimal surface-generated junction leakage current, the preferred method of fabrication starts with a high resistivity semiconductor substrate material of a first conductivity type and comprises the following steps:

forming protective isolation regions into the surface of selected portions of the semiconductor;

implanting, at 20 to 380 keV, ions of the first conductivity type into the semiconductor to form a well of the first conductivity type shaped as an annulus such that a selected central portion of the semiconductor remains unimplanted;

implanting, at 50 to 700 keV, ions of the opposite conductivity type into the central portion to form a well having side walls surrounded by the well of the first conductivity type;

implanting, at 20 to 160 keV and 1·10E12 to 5·10E13 cm-2 dose, ions of the first conductivity type into at least one selected portion of the well of the opposite conductivity type to form, under and near the surface, a region of compensated conductivity, thereby extending along the surface under the insulator the well of the first conductivity;

rapidly annealing the ion implants;

depositing over portions of the surface a layer of insulating material suitable as gate dielectric;

forming gates of poly-silicon or other conductive material deposited onto the insulating layer;

forming source and drain regions to complete the diode and transistors; and forming contact metallizations at the source and drain regions.

The sequence of the ion implant steps can be executed in any order; they can be reversed from the order given above.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. One example is the choice between p- or n-type dopants for the first conductivity type. Another example is the diodes used in logic and analog circuits as candidates for suppressing surface-induced leakage currents. It is therefore intended that the appended claims encompass any such modifications or embodiments.

We claim:

1. A pixel fabricated as an CMOS integrated circuit, comprising:

a photodiode formed by an n-well surrounded by a p-well, and having a cathode contact;

a reset MOS transistor having source, drain, and gate, said reset gate positioned across the junction formed by said p-well and said n-well, for diode control, and said reset source merged with said photodiode cathode; and a sensing MOS transistor having source, drain and gate, said sensing source combined with said reset drain, and said sensing gate electrically connected to said reset source;

whereby the leakage current of said photodiode is greatly reduced and the density of said pixel much improved.

2. A pixel fabricated as an integrated circuit in the active surface of a semiconductor substrate of a first conductivity type, selected portions of said surface protected by an insulator, comprising:

a light-sensing diode comprising a first well of said first conductivity type, shaped as an annulus having side walls, said side walls at least partially surrounding a second well of the opposite conductivity type, thereby forming junctions with said first well, at least one of said junctions reaching a surface portion unprotected by said insulator;

said second well having an electrical contact at said surface, forming the cathode of said diode;

said second well further forming junctions with said substrate remote from said surface;

a first MOS transistor, operable as the reset switch, having source, drain and gate terminals fabricated such that said source is merged with said cathode and said gate, positioned on the gate oxide, extends across regions of both first and second well, thus extending across said junction at said surface for diode control;

a second MOS transistor, operable as the sensing transistor, merged with said first transistor such that the source of said second transistor is combined with drain of said first transistor, and the gate of said second transistor is electrically connected with said source of said first transistor, whereby the fill factor is maximized; and contacts for applying electrical bias across said diode junctions and to said transistor terminals.

3. The pixel according to claim 2 further comprising electrical connections of said source of said second transistor to the reset voltage supply, and said gate of said first transistor to the reset control.

4. The pixel according to claim 2 further comprising a third MOS transistor, coupled to said second transistor and operable as a pixel select switch.

5. The pixel according to claim 2 further comprising said first well having at least one extension along said surface under said insulator into said second well, thereby forming a buried near-the-surface junction with said second well and constricting the surface area within which said junction intersects said surface.

6. The pixel according to claim 5 wherein said well extension extends from the surface to a depth between 0.5 and 1.0 μm.

7. The pixel according to claim 2 wherein said first conductivity type is p-type.

8. The pixel according to claim 2 wherein said contacts are pads or electrically conductive regions to said terminals, wells and substrate.

9. The pixel according to claim 2 wherein said substrate has high resistivity and said first well has a doping concentration higher than said substrate.

10. The pixel according to claim 2 wherein said second well has a doping concentration at said deep junction suitable to provide, under electrical reverse bias, a wide space charge region, attributing high light sensitivity to said diode.

11. The pixel according to claim 5 wherein said extensions have a doping concentration at said surface-near junction suitable to provide, under electrical reverse bias, space charge regions which are sensitive to light of shallow penetration depth, attributing improved light responsivity to said diode.

12. The pixel according to claim 5 wherein said constricted surface area minimizes dark current in electrical operation.

13. The pixel according to claim 2 wherein said diode and said transistors are fabricated in a process flow according to CMOS technology materials, dimensions and process steps.

14. A pixel fabricated as an integrated circuit in the active surface of a semiconductor substrate of a first conductivity type, selected portions of said surface protected by an insulator, comprising:

a light-sensing diode comprising a first well of said first conductivity type, shaped as an annulus having side walls, said side walls at least partially surrounding a second well of the opposite conductivity type, thereby forming junctions with said first well, at least one of said junctions reaching a surface portion unprotected by said insulator;

said second well having a silicided electrical contact at said surface, remote from said junction reaching said surface and separated from said junction by a portion of said surface insulator, whereby said leakage-generating silicide is removed from the proximity to the space charge region of said junction, said contact forming the cathode of said diode;

said second well further forming junctions with said substrate remote from said surface;

a first MOS transistor, operable as the reset switch, having source, drain and gate terminals fabricated such that said source is merged with said cathode and said gate, positioned on the gate oxide, extends across regions of both first and second well, thus extending across said junction at said surface for diode control;

a second MOS transistor, operable as the sensing transistor, merged with said first transistor such that the source of said second transistor is combined with said drain of said first transistor, and the gate of said second transistor is electrically connected with said source of said first transistor; and contacts for applying electrical bias across said diode junctions and to said transistor terminals.

15. The pixel according to claim 14 further comprising said first well having at least one extension along said surface under said insulator into said second well, thereby forming a buried near-the-surface junction with said second well and constricting the surface area within which said junction intersects said surface.

16. The pixel according to claim 15 wherein said well extension extends from the surface to a depth between 0.5 and 1.0 $\mu$m.

17. The pixel according to claim 14 wherein said first conductivity type is p-type.

18. The pixel according to claim 14 further comprising a third MOS transistor, operable as the pixel select switch and coupled to said second transistor.

* * * * *